(12) United States Patent
Weems, II

(10) Patent No.: US 7,385,519 B2
(45) Date of Patent: Jun. 10, 2008

(54) APPARATUS AND METHOD FOR OPERABILITY AND LIVE-DEAD-LIVE TESTING

(75) Inventor: Warren Alfred Weems, II, Avondale, AZ (US)

(73) Assignee: WMW Technologies, LLC, Avondale, AZ (US)

( * ) Notice: Subject to any disclaimer, the term of this patent is extended or adjusted under 35 U.S.C. 154(b) by 270 days.

(21) Appl. No.: 11/165,702

(22) Filed: Jun. 23, 2005

(65) Prior Publication Data

US 2005/0237048 A1    Oct. 27, 2005

Related U.S. Application Data

(63) Continuation-in-part of application No. 10/707,635, filed on Dec. 29, 2003, now abandoned.

(51) Int. Cl.
*G08B 21/00* (2006.01)
*H01H 31/02* (2006.01)

(52) U.S. Cl. .......... 340/641; 340/653; 340/815.4; 324/556

(58) Field of Classification Search .......... 340/641, 340/653, 656; 324/149, 114, 115, 508, 539, 324/542, 556
See application file for complete search history.

(56) References Cited

U.S. PATENT DOCUMENTS

| | | | |
|---|---|---|---|
| 4,724,382 A * | 2/1988 | Schauerte ............. | 324/133 |
| 4,962,347 A | 10/1990 | Burroughs et al. ........... | 320/48 |
| 5,285,163 A * | 2/1994 | Liotta .......................... | 324/508 |
| 5,642,052 A * | 6/1997 | Earle ........................... | 324/556 |
| 5,923,161 A * | 7/1999 | Frankovitch et al. ....... | 324/115 |
| 6,646,562 B1 * | 11/2003 | Chang ........................ | 340/664 |
| 6,979,787 B2 * | 12/2005 | Davies ....................... | 200/51 R |
| 7,106,045 B2 * | 9/2006 | Jungwirth et al. .......... | 324/113 |

OTHER PUBLICATIONS

Web Site Pages (www.stardrive.net) Author—Harold H. Metzner, Date—Feb. 25, 2002.

* cited by examiner

*Primary Examiner*—Toan N Pham
(74) *Attorney, Agent, or Firm*—Wright Law Group, PLLC; Mark F. Wright

(57) ABSTRACT

An operability testing apparatus used in conjunction with an electrical testing apparatus to perform live-dead-live tests consists of: a power source; a voltage source coupled to the power source with the voltage source being configured to provide an AC voltage output and/or a DC voltage output; and one or more visual indicators. The visual indicator(s) are configured to indicate operability for electrical testing equipment such as voltmeters and the like. The probes or leads of electrical testing equipment are inserted into apertures in the apparatus. The apparatus provides an output, allowing a determination to be made as to the operability of the electrical testing equipment. Then, the test leads or probes are applied to the subject electrical circuit or equipment to ensure that the subject electrical circuit or equipment is de-energized. Then, the probes or leads are inserted into the apparatus once again as a final test to ensure that the electrical testing equipment has remained operable and is functioning correctly.

20 Claims, 4 Drawing Sheets

APPARATUS AND METHOD FOR OPERABILITY AND LIVE-DEAD-LIVE TESTING

CROSS REFERENCE TO RELATED APPLICATIONS

This application is a continuation-in-part of U.S. patent application Ser. No. 10/707,635 filed on Dec. 29, 2003, which application is now abandoned, which application is incorporated herein by reference.

BACKGROUND OF THE INVENTION

1. Technical Field

The present invention relates generally to the field of electrical test equipment and more particularly to the field of operability testing for voltmeters and/or similar devices at their point of use.

2. Background Art

Voltage is a term used to describe the amount of energy or electromotive force available to move a certain amount of electrons from one point to another in an electrical circuit, which results in a difference in electrical potential between two points. For most purposes, voltage can be characterized as one of two types, alternating current (AC) or direct current (DC) voltage. Both of these voltage types are commonly used to supply power to various electrical circuits and electrical equipment. A conductor is a material or object that offers a pathway for electrons or current to flow from one point to another in the presence of an applied voltage.

When voltage or electrical pressure is exerted upon a conductive closed loop or circuit, current will flow within the circuit. However, if voltage is applied to an open circuit no current will flow. Regardless of whether or not current flows in an open or closed circuit, both circuits are "energized" by the application of voltage and the voltage differential between two points in the circuit. Similarly, two or more conductors, with an earthen or equipment ground (i.e., reference ground) considered to be one of the conductors and having a voltage differential between the conductors, are considered energized. Resistance is a closely related concept that describes a material or object with physical properties that reduce or restrict the flow of electrons or electrical current in a conductor. Current and resistance are generally inversely proportional in that the higher the level or measurement of resistance in a given circuit, the lower the corresponding current flow in that circuit will be. For purposes of this discussion, the terms "electrical circuit" or "electrical equipment" may be broadly interpreted to mean any type of electrical device or mechanism which is capable of conducting current when a voltage is applied to the circuit.

An appropriately configured electrical instrument can be used to determine whether or not there is a difference in electrical potential between two given points in a circuit. The electrical instrument used will generally indicate a difference in potential by providing some type of feedback to the user of the electrical instrument. For example, a visual indication such as an illuminated light bulb, an audible sound, or a combination of the two may be employed. Several electrical instruments are currently available such as audio emitting instruments containing piezo electric sound or tone generators or light emitting instruments such as neon test probes that indicate voltage. Additionally, voltage measuring meters such as the "Simpson" meter, solenoid driven voltage meters such as the "Wiggins" meter, and various digital voltmeters are also available for this use.

A voltage measuring meter or voltmeter can be used to perform at least two functions when there is a difference in electrical potential in a given circuit. First, the voltmeter can be used to indicate the presence of voltage and second, to determine the magnitude or amount of the difference in voltage potential. For purposes of this discussion, the terms "electrical testing apparatus" may be broadly interpreted to mean any type of electrical instrument which is commonly used to determine a difference in electrical potential.

Although the human body varies from person to person, it is generally accepted throughout the electrical industry that a level of around 500ma of current passed through the heart can stop the heart and cause severe injury or, in some cases, death. A certain level of voltage will be required to push the current through the resistance of the human body as described by Ohm's law where voltage/resistance=current. When a technician uses an electrical testing apparatus against a known voltage source, the technician maybe taking a risk that is more significant than the risk of working on a circuit without testing the circuit to determine if it is energized or not. For example, in attempting to verify the operability of his equipment, the technician might use a known 480V 100 A source when the actual circuit to be worked on is a 50V 5 A circuit. In this situation, the technician is in greater danger from the current associated with the 480V source than the 50V circuit to be worked on.

An electrical testing apparatus, such as a voltmeter, is generally considered to be a very high resistance device so that very little current flows through the electrical testing apparatus when determining if a difference in potential exists. Therefore, a standard electrical testing apparatus consumes very little power during use. To use the electrical testing apparatus, a first electrical sensing test probe or lead will be applied to one point in the circuit and a second electrical sensing test probe or lead will be applied to a second point in the circuit. With the electrical testing apparatus activated, an illuminated light or audible sound or voltage indication seen on a voltage meter will generally signify that there is a measurable difference in potential between the two points being tested. In this fashion an electrical testing apparatus can be utilized to determine whether or not a circuit is energized or de-energized and an appropriately configured voltage measuring meter can determine the magnitude of the voltage present.

An electrical testing apparatus, such as a voltmeter, may be routinely used in the electrical and power generation industries to facilitate equipment diagnostics and repair. In these applications, a worker will utilize a voltmeter to ensure a piece of equipment or a circuit is de-energized prior to disassembling or working on the equipment since working in an energized environment can lead to undesirable consequences. An electrical testing apparatus that does not provide an accurate indication or reading of the electrical potential in an electrical circuit can inadvertently lead a user to believe that a circuit is de-energized when, in fact, the circuit is energized. This situation is quite dangerous and can lead to many hazards with varying consequences, ranging from the very minor to the very serious, including damage to electrical equipment, shocks and burns or even death for the user of the faulty electrical testing apparatus as well as his/her co-workers.

In an attempt to avoid the dangers described above, the Occupational Safety & Health Administration (OSHA) has adopted certain regulations including Standards 29 CFR under which "Selection And Use Of Work Practices 1910.333" has been incorporated. Paragraph 1910.333(b) (2)(iv)(B) states: "A qualified person shall use test equipment to test the circuit elements and electrical parts of equipment to which employees will be exposed and shall verify that the circuit elements and equipment parts are de-energized. The test shall also determine if any energized condition exists as a result of inadvertently induced voltage or unrelated voltage backed even though specific parts of the circuit have been de-energized and presumed to be safe. If the circuit to be tested is over 600 volts, nominal, the test equipment shall be checked for proper operation immediately after this test."

For compliance with this directive, an electrical testing apparatus such as a voltmeter is commonly used to test the circuit elements and electrical parts of the circuit or electrical equipment to verify that they are de-energized prior to any activity with the circuit or equipment that might expose a worker to potentially dangerous level of voltage. This is known throughout the industry as a "test before touch" philosophy. Even though the OSHA guidelines specifically point out that the test equipment used to verify voltages above 600 volts need only be checked for proper operation immediately after testing for energized circuits has occurred, many companies have adopted this safety practice for all voltages in excess of 50V.

Before working on a circuit, a common "safe working practice" is to check the functionality of the electrical testing apparatus on a known energized voltage source to verify that the electrical testing apparatus is in fact operational. These checks also verify that the electrical testing apparatus's test probes and test leads are functional. The electrical testing apparatus is then used to check and verify whether or not the circuit and/or equipment to be worked on is de-energized. As a last check to verify it did not fail during the circuit testing, the electrical testing apparatus is again checked against the known energized voltage source. This testing procedure is commonly referred to as a live-dead-live (LDL) check.

Currently known techniques for performing the LDL check of an electrical testing apparatus generally require that the user locate a known and quantified energized source and verify that the electrical testing apparatus is operating properly by testing it on the known voltage source. The user then uses the electrical testing apparatus to check the circuit or equipment to be worked on to verify it is de-energized, as evidenced by the visual or audible indication provided by the electrical testing apparatus. Finally, before starting to work on the circuit/equipment, the user re-verifies that the electrical testing apparatus is operating properly by re-checking it against the known voltage source. If the electrical testing apparatus operates properly during the final check against the known voltage source, then the user would know that the electrical testing apparatus had not suffered a failure during the testing process. If the LDL check is performed correctly, with properly functioning equipment, the possibility of accidental exposure to electrical energy can be minimized or eliminated.

The known techniques and methods of performing a LDL check of an electrical testing apparatus set forth herein can be very time consuming and, in certain circumstances, may provide a false sense of security to the user. For example, if there is an intermittent problem with the electrical testing apparatus or its test leads and no voltage is indicated during the LDL check, the user may not know if the circuit is de-energized or if the electrical testing apparatus is simply malfunctioning. Additionally, if the circuit or equipment to be worked on is located in an area where a known voltage source is not present or readily available, the user must leave the area to verify the electrical testing apparatus is operating properly. Accordingly, in cases where both AC and DC voltage may need to be verified, the LDL process may have to be repeated twice, so that the user can verify that the electrical testing apparatus is operating properly for both types of voltage. This technique/methodology is obviously inconvenient and time consuming and, in some cases, may tempt the user to skip the LDL checks entirely. This decision could lead to undesirable consequences, as the unverified electrical testing apparatus then becomes the sole barrier in preventing personnel injury and/or equipment damage.

In addition to the obvious inconvenience, the electrical testing apparatus could theoretically pass an LDL check but still be inoperative at the time of testing the circuit or equipment. For example, due to an intermittent problem that presents itself only while moving from the location where the initial electrical testing apparatus verification was performed to the work location, a faulty electrical testing apparatus could still indicate the circuit/equipment is de-energized when it is in fact energized. The user may attempt to minimize this possibility by carrying a portable voltage source to the work area to perform the LDL checks. This procedure requires that the user carry a portable AC and/or DC source, which is often large and heavy, and possibly an extension cord to the work area. He or she may also need to locate a reliable power source to feed the portable power unit to avoid inaccurate results while performing the LDL checks. In addition, many industrial and commercial facilities utilize circuits and/or equipment that are located in somewhat hazardous environments. Normally, for safety and environmental reasons, every effort is made to minimize both the amount of time spent in the hazardous work area as well as the amount of test equipment taken into the work area. Once again, this technique/methodology is obviously inconvenient and time consuming.

As shown by this discussion, while certain techniques currently exist to perform operability and LDL tests using electrical testing apparatuses, challenges still exist and certain limitations remain. Accordingly, without improved apparatus and methods for performing operability and LDL checks, inadvertent exposure to live electrical current will remain a very real possibility.

BRIEF SUMMARY OF THE INVENTION

An operability testing apparatus used in conjunction with an electrical testing apparatus to perform live-dead-live tests consists of three main components: a power source; a voltage source coupled to the power source with the voltage source optimally being configured to provide an AC voltage output(s) and/or a DC voltage output(s); and one or more visual indicators. The visual indicators are configured to indicate operability of the operability testing apparatus when confirming that the electrical testing apparatus, such as voltmeters and the like, are functioning properly.

The probes or leads of an electrical testing apparatus are inserted into apertures in the operability testing apparatus. The operability testing apparatus provides a voltage output, allowing a determination to be made as to the operability of the electrical testing apparatus. Then, the test leads or probes are applied to the subject electrical circuit or electrical equipment to ensure that the subject electrical circuit or equipment is de-energized. Then, the probes or leads of the electrical testing apparatus are inserted into the apertures of the operability testing apparatus once again as a final test to ensure that the electrical testing apparatus has remained operable and is functioning properly. The operability testing apparatus may be a self-contained unit or integrated with other hand-held devices such as flashlights, voltmeters and the like to form a combination device comprising both an electrical testing apparatus and an operability testing apparatus.

BRIEF DESCRIPTION OF THE DRAWINGS

The preferred embodiments of the present invention will hereinafter be described in conjunction with the appended wherein like designations denote like elements and.

DETAILED DESCRIPTION OF THE INVENTION

The present invention relates to an apparatus and a method or methods used to perform operability checks and LDL tests on an electrical testing apparatus such as a voltmeter and the like. By using the preferred embodiments of the present invention, greater safety can be provided by ensuring that electrical circuits and equipment are de-energized prior to accessing them. With its relatively small size and easy operation, the operability testing apparatus of the present invention is readily portable, convenient to use, and will provide an improvement over the known art.

Figure 1:
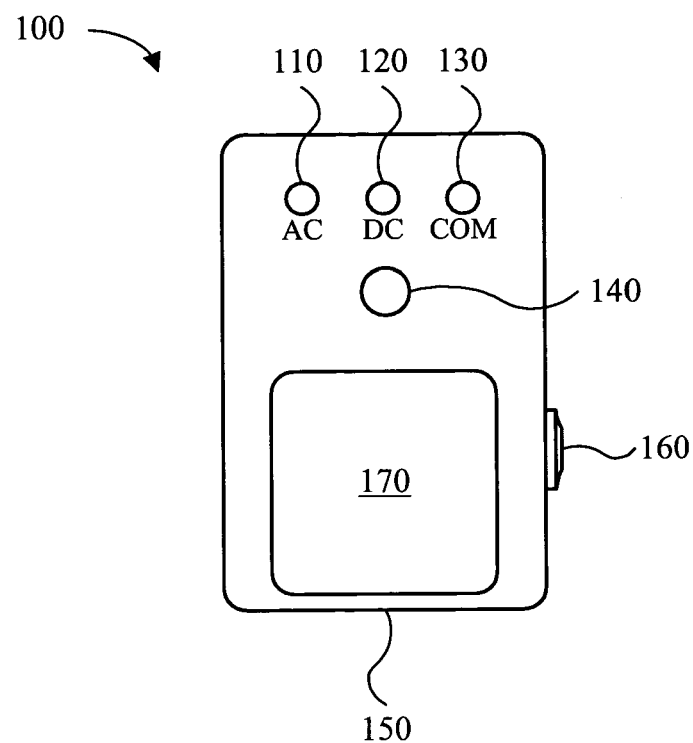
FIG. 1 is a plan view of an operability testing apparatus for verifying operability and performing LDL checks in accordance with a preferred exemplary embodiment of the present invention.

Referring now to FIG. 1, an operability testing apparatus 100 for conducting operability testing of electrical testing equipment in conjunction with performing an LDL check in accordance with a preferred exemplary embodiment of the presenting invention comprises: an AC voltage test point or aperture 110; a DC voltage test point or aperture 120; a ground test point or aperture 130; a visual indicator 140; a housing 150; a on-off switch 160; and an optional instruction label 170.

Those skilled in the art will recognize that AC voltage aperture 110 and DC voltage aperture 120 are merely representative of the types of test points or apertures that could be implemented in one preferred exemplary embodiment of the present invention. Other preferred embodiments of the present invention may incorporate additional test points or apertures and the various test points or apertures may include test points or apertures configured to supply higher and/or multiple voltage ranges for specific applications. Additionally, instead of apertures, the test points could be implemented as contact points, cradles, etc. Apertures have been selected primarily because they offer relatively reliable and secure test points that can be readily configured to receive electrical testing apparatus test probes such as voltmeter test probes.

AC voltage aperture 110 is the aperture for providing an AC voltage source. If an AC electrical circuit or piece of electrical equipment is to be tested, one of the probes or the leads of the electrical testing apparatus to be used in the testing process would be inserted into AC voltage aperture 110.

DC voltage aperture 120 is the aperture for providing a DC voltage source. If a DC electrical circuit or piece of electrical equipment is to be tested, one of the probes or the leads of the electrical testing apparatus to be used in the testing process would be inserted into DC voltage aperture 120.

Ground aperture 130 is the common or reference "ground" point for the voltage differential supplied by operability testing apparatus 100. With one probe or lead of the electrical testing apparatus inserted into either AC voltage aperture 110 or DC voltage aperture 120 and the other probe or lead inserted into ground aperture 130, operability testing apparatus 100 can be configured to supply a voltage to the electrical testing apparatus.

Visual indicator 140 is provided to indicate the operational readiness of operability testing apparatus 100. When on-off switch 160 is activated, visual indicator 140 will provide a visual indication that testing operability testing apparatus 100 is functional and operative for providing the requisite voltage required for operability testing of the electrical testing apparatus. If, however, visual indicator 140 does not provide an appropriate visual indication when on-off switch 160 is activated, then the technician will be alerted that operability testing apparatus 100 is not operational. This will prevent or minimize the inadvertent use and possible reliance on an inoperable operability testing apparatus 100.

Housing 150 is most preferably a small, durable, lightweight housing that is easy to transport and store. In the most preferred embodiments of the present invention, housing 150 is manufactured from a non-conductive plastic material such as polycarbonate. In the most preferred embodiments of the present invention, housing 150 houses or otherwise contains AC voltage aperture 110, DC voltage aperture 120, ground aperture 130, visual indicator 140, on-off switch 160 and optional instruction label 170. Those skilled in the art will recognize that in certain alternative preferred embodiments of the present invention, housing 150 may comprise additional apertures to provide for the testing of multiple or alternative voltage ranges with a single device.

For example, in at least one alternative preferred embodiment of the present invention, housing 150 may be configured with 2 AC voltage apertures 110 to accommodate multiple AC voltage ranges in a single operability testing apparatus 100. Similarly, in yet another alternative preferred embodiment of the present invention, housing 150 may be configured with 2 DC voltage apertures 120 to accommodate multiple DC voltage ranges in a single operability testing apparatus 100. The actual configuration of apertures will depend on the specific application and the requirements of a given user. Those skilled in the art will recognize that many permutations and combinations of apertures may be utilized in various preferred embodiments of the present invention.

On-off switch 160 is used to energize or activate apparatus 100. In the "on" position, operability testing apparatus 100 is capable of providing a voltage differential for the purpose of performing operability testing on an electrical testing apparatus. In the "off" position, the voltage providing generating circuitry of operability testing apparatus 100 is de-energized to conserve power.

Optional instruction label 170 is an indicia-bearing label that provides information for the successful operation of operability testing apparatus 100. For example, the testing methodology for performing LDL checks in accordance with the preferred exemplary embodiments of the present invention may be printed on instruction label 170. Additionally, product warning instructions, operational instructions and warranty information may also be provided on instruction label 170.

Figure 2:
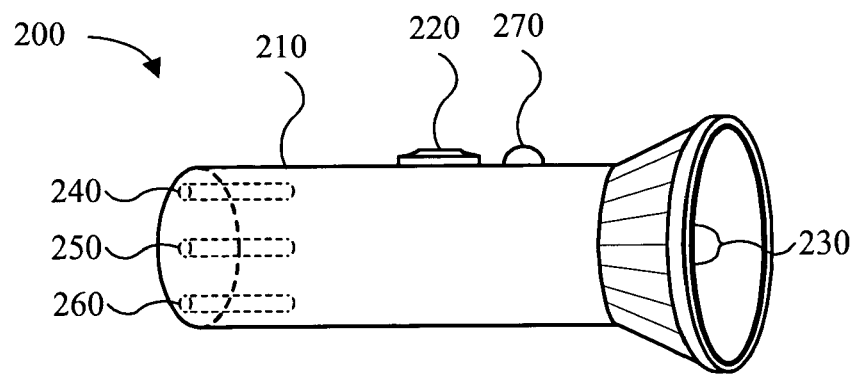
FIG. 2 is a plan view of an operability testing apparatus for verifying operability and performing LDL checks in accordance with an alternative preferred exemplary embodiment of the present invention.

Referring now to FIG. 1 and FIG. 2, a flashlight 200 with an integrated operability testing apparatus 100 for conducting operability testing of electrical testing apparatus in conjunction with performing an LDL check in accordance with a preferred exemplary embodiment of the presenting invention is shown. Flashlight 200 includes a housing 210, an on-off switch 220, a light bulb 230, and testing apertures 240, 250, and 260. In addition to performing the normal functions of a flashlight, flashlight 200 performs the functions of testing apparatus 100 and an electrical testing apparatus described above in conjunction with FIG. 1.

Specifically, housing 210 will house the operability testing apparatus 100 and on-off switch 220 is configured to perform the functions of on-off switch 170. This can be accomplished by utilizing a 3-way switch. Similarly, light bulb 230 may be configured to provide standard flashlight illumination and also be configured to perform the functions of visual indicator 140. Finally, testing apertures 240, 250, and 260 are configured to perform the functions of AC voltage aperture 110, DC voltage aperture 120, and ground aperture 130. In this fashion, the user of flashlight 200 can use flashlight 200 to perform the standard functions of any flashlight and can also perform LDL checks in accordance with the preferred exemplary embodiments of the present invention set forth herein. In an alternative preferred embodiment of the present invention, housing 210 may be configured with an optional LED 270 that may be configured to provide the functionality of visual indicator 140 from FIG. 1. In this embodiment, light bulb 230 will perform the standard flashlight illumination and LED 270 will provide the functionality of visual indicator 140 from FIG. 1.

Figure 3:
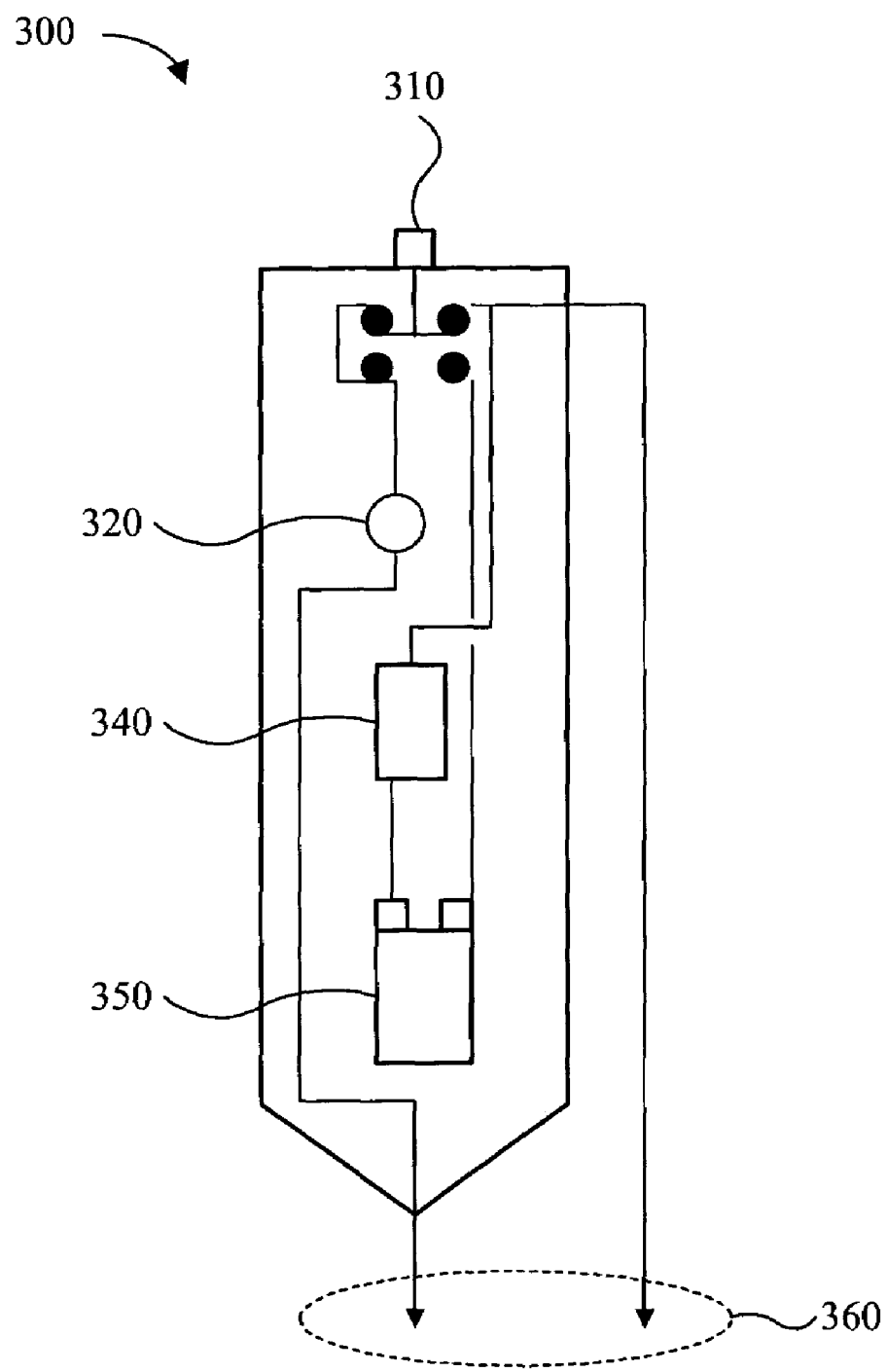
FIG. 3 is a schematic circuit diagram for implementing an operability testing apparatus for verifying operability and performing LDL checks in accordance with a preferred exemplary embodiment of the present invention.

Referring now to FIG. 3, a schematic diagram of a circuit 300 for an apparatus combining an electrical testing apparatus, such as a neon test light, with an operability testing apparatus in accordance with a preferred exemplary embodiment of the presenting invention is shown. Circuit 300 comprises a switch 310; a visual indicator 320; a voltage source 340; a power source 350; and a pair of test leads or probes 360.

When using the device embodied in circuit 300 as an operability testing apparatus, switch 310 must be depressed, causing probes 360 to be energized by electrically connecting voltage source 340 and power source 350 to probes 360. Similarly, when probes 360 are touched together, visual indicator 320 is energized when depressing switch 310; thereby verifying that circuit 300 is operational as an operability testing apparatus.

With switch 310 depressed, visual indicator 320 is provided to offer visual feedback as to the operability of circuit 300. Visual indicator 320 is most preferably a neon light, or the like that is illuminated when switch 310 is depressed and remains illuminated as long as switch 310 is depressed and probes 360 are in contact with each other. If visual indicator 320 fails to illuminate when switch 310 is depressed, with probes 360 in contact with each other, circuit 300 is inoperable or power source 350 has been depleted beyond its useful capacity, indicating that the combined device should not be relied upon to perform an LDL check.

When using the combined device as an electrical testing apparatus, switch 310 is not depressed, leaving voltage source 340 and power source 350 not connected to visual indicator 320. However, when switch 310 is not depressed, probes 360 are connected solely to visual indicator 320 through switch 310. Thus by connecting circuit 300 to the electrical circuit or electrical equipment to be worked on, verification as to whether the being de-energized or dead can be determined accurately, indicated by visual indicator 320 not illuminating, thus completing the "dead" portion of the LDL check. Should the connection of circuit 300 to the electrical circuit or electrical equipment to be tested cause visual indicator 320 to illuminate when switch 310 is not depressed, the circuit to be worked on would be considered energized.

Visual indicator 320 is provided to offer visual feedback as to the operability of circuit 300. Visual indicator 320 is most preferably a neon light, an LED, or similar device that is illuminated when switch 310 is depressed and remains illuminated as long as switch 310 is depressed and probes 360 are in contact with each other. If, during an operability testing apparatus check, visual indicator 320 fails to illuminate when switch 310 is depressed and while probes 360 are in contact with each other, circuit 300 is inoperable or power source 350 has been depleted beyond its useful capacity. This would indicate to the user that the device should not be relied upon to perform an LDL check.

Voltage source 340 is any type of electrical circuitry that is suitable to create an AC and/or DC voltage differential in circuit 300 at probes 360 that would normally be required to illuminate light 320. Those skilled in the art will readily recognize that there are many ways to implement voltage source 340 including invertors, bridges, etc. Any of these circuit configurations are considered to be within the scope of the present invention.

Power source 350 represents any type of electrical device that can be suitably deployed to provide the necessary power for circuit 300. In the most preferred embodiments of the present invention, power source 350 will be implemented as a battery. In the most preferred embodiments of the present invention, a 9V battery will be used. As previously discussed in conjunction with FIG. 2, in the case of flashlight 200, power source 350 may be the same batteries that are used to provide illumination. Similarly, the functionality of switch 310 may be provided by switch 220 of FIG. 2. Those skilled in the art will recognize that as a relatively high resistance device, the operability testing apparatus circuitry shown in circuit 300 draws a relatively small amount of current and, accordingly, can be powered by a small power source 350. While a 9V battery is the most preferred exemplary embodiment, other types of batteries may be suitably deployed and substituted for the 9V battery.

Output probes 360 are representative of the electrical probes or leads of the combined operability and electrical testing apparatus equipment. Given that a neon test light typically requires approximately 80 volts to be illuminated, a circuit will generally be included in circuit 300 to boost the voltage output from power source 350 (9 volt battery or other power source) up to approximately 80 volts or greater. To perform an operability test, the user will touch probes 360 together and depress switch 310. This will cause power source 350 to feed the voltage supply 340 and supply the appropriate voltage to illuminate light 320. This indicates that light 320 is functional and that the proper voltage level is being supplied by circuit 300. Then, switch 310 is released, thereby removing the circuitry previously used to supply the higher voltage level. Next probes 360 will used to test a field circuit to see if it was live. If it was live and supplied a voltage in excess of 80 volts, then light 320 will be illuminated, demonstrating that the circuit was energized and, accordingly, un-safe to work on.

Figure 4:
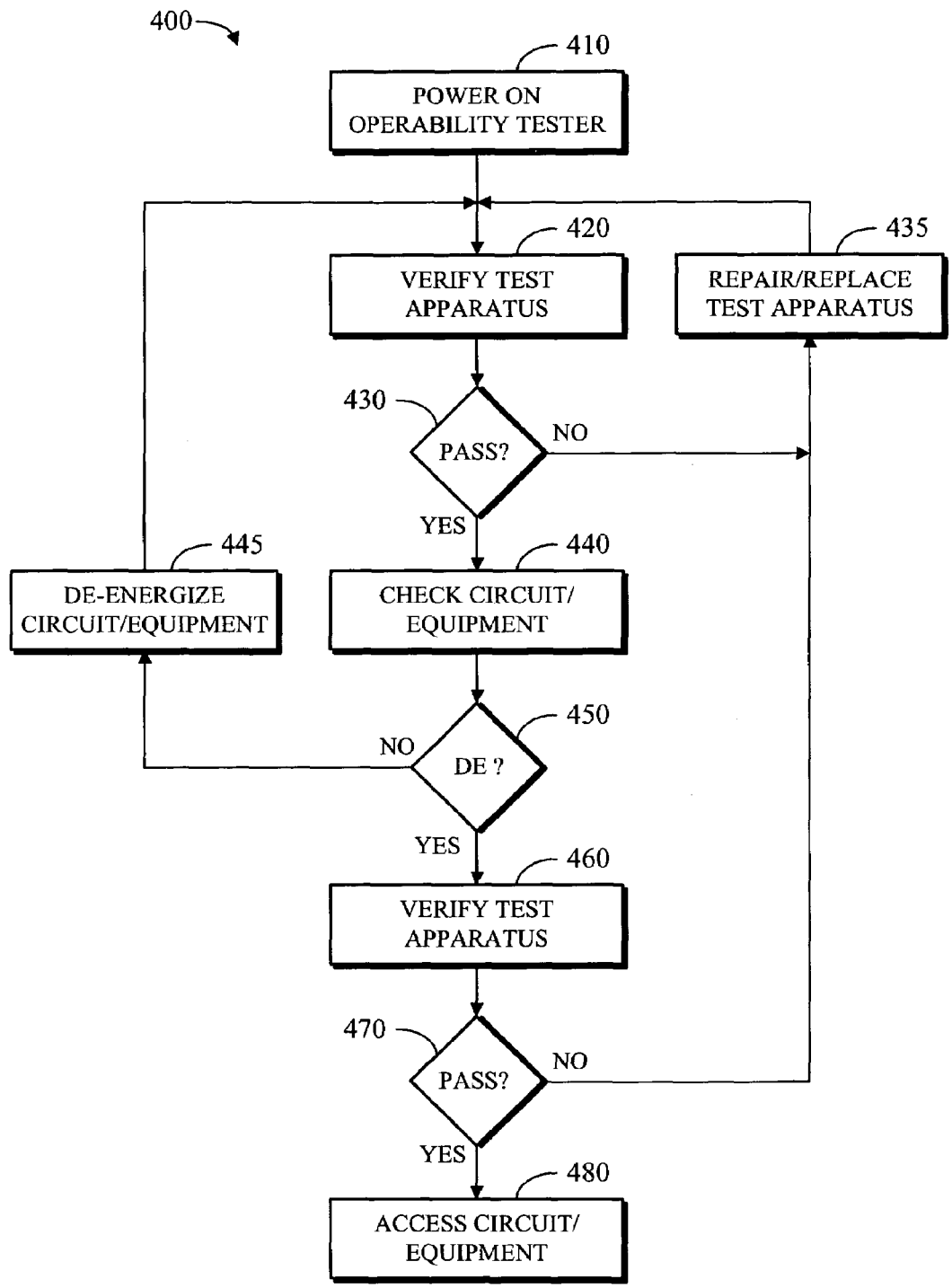
FIG. 4 is a method for performing LDL checks using an operability testing apparatus in accordance with a preferred exemplary embodiment of the present invention.

Referring now to FIG. 4, a method 400 for implementing operability testing of electrical testing apparatus in accordance with a preferred exemplary embodiment of the presenting invention is shown. As shown in FIG. 4, the operability testing apparatus is activated (step 410) for use. As part of this process, the operability of the operability testing apparatus may be verified as well. As previously explained, a visual indicator, such as an LED or, in the case of for combined device, a neon light may be associated with the operability testing apparatus and used to verify the operability of the operability testing apparatus.

Once activated, the electrical testing apparatus is verified using the operability testing apparatus (step 420). As previously explained, this may be accomplished by connecting the test leads or probes of the electrical testing apparatus to the appropriate portion of the operability testing apparatus. If, in the case of device as shown in FIG. 3, the probes will need to be connected in order to verify the operability of the electrical testing apparatus portion of the device. If the electrical testing apparatus passes (step 430="YES"), then the technician will proceed to the testing of the electrical circuit or equipment to ensure that it has been de-energized (step 440). If, however, the electrical testing apparatus does not pass the operability check (step 430="NO"), then the electrical testing apparatus must be repaired or replaced (step 435) and the testing process started once again.

Once the electrical testing apparatus has successfully passed the initial operability testing (step 430="YES"), then the electrical circuit or electrical equipment may be tested (step 440) to determine whether or not the electrical circuit or equipment has been de-energized. If the electrical circuit or equipment has not been de-energized (step 450="NO"), then the electrical circuit or equipment should be de-energized (step 445) prior to proceeding and the testing procedure should be conducted once again.

If, however, the electrical circuits or equipment have been de-energized (step 450="YES"), then the technician can once again verify the operability of the electrical test apparatus (step 460). If the electrical testing apparatus passes the second operability test (step 470="YES"), then the technician will proceed to access and/or repair the electrical circuit or equipment (step 480). If, however, the electrical testing apparatus does not pass the operability check (step 470="NO"), then the electrical testing apparatus must be repaired or replaced (step 435) and the testing process started once again. By following method 400, the technician will be in compliance with the OSHA guidelines and the industry standard operational procedure for conducting LDL checks, thereby enhancing electrical safety.

Accordingly, by adopting one or more of the various preferred exemplary embodiments described herein, a technician user can quickly and easily verify operability and functionality of their electrical testing apparatus equipment in the field. The technician will carry the operability testing apparatus and the electrical testing apparatus to the appropriate location where the subject electrical circuit or equipment is located. Once operability testing apparatus is energized, the visual indicator will affirm that the operability testing apparatus is functional.

Next, the test probes or leads will be inserted into the desired apertures (AC or DC and ground) provided in the operability testing apparatus and an appropriate reading will be displayed on the electrical testing apparatus to confirm that the electrical testing apparatus is operational. In the case of a combined device there will be no apertures and the probes will connected together for the testing process. The technician can then use the electrical testing apparatus equipment to verify that the circuit/equipment to be worked on is de-energized. After the voltage check on the circuit/equipment has been completed, the technician will again insert the probes or leads into the provided apertures or touch the probes together and push the switch for a combined device to verify that the electrical testing equipment remains operational; indicating the circuit/equipment to be worked on is truly de-energized and safe to work on.

Figure 5:
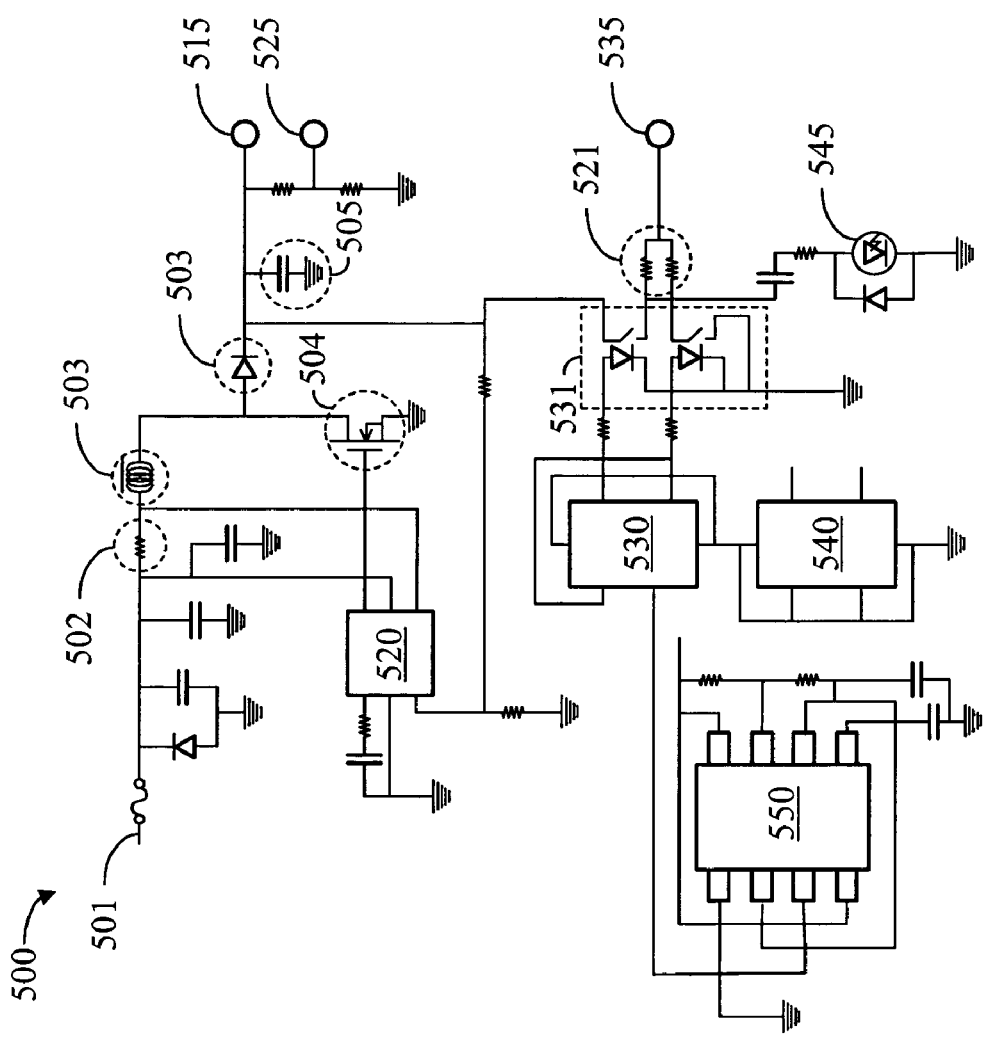
FIG. 5 is a schematic circuit diagram for implementing an operability testing apparatus for verifying operability when used in conjunction with an electrical testing apparatus used to perform LDL checks in accordance with an alternative preferred exemplary embodiment of the present invention.

Referring now to FIG. 5, a schematic diagram of a circuit 500 for implementing an operability testing apparatus for verifying operability and performing LDL checks in accordance with an alternative preferred exemplary embodiment of the present invention is shown. As shown in FIG. 5, a power source may be connected to circuit 500 at point 501. As previously explained, this is most preferably a 9V battery. The main components of circuit 500 include current mode boost regulator 520, flip flops 530 and 540, and an astable multivibrator 550. Aperture 515 is a DC aperture, aperture 525 is a common or ground aperture, and aperture 535 is an AC aperture. Test probes may be inserted into apertures 515, 525, and 535 as desired and as previously explained.

Current mode booster regulator 520 is designed to produce output voltage higher than the input voltage. Given that current mode booster regulator 520 is not capable of switching high voltages, transistor 504 is provided to switch the higher voltage levels. Inductor 503 represents an energy storage device and current passing through inductor 503 produces a magnetic field when transistor 504 is energized. Once the current passing through resistor 502 reaches a level of 200 millivolts, current mode booster regulator 520 will de-energize transistor 504. Once transistor 504 has been de-energized, the energy stored in inductor 503 is transferred through diode 503 to capacitor 505, eventually charging it to approximately 100V.

Flip flops 530 and 540 represent a clocked flip flop configuration used to provide a symmetrical square wave with a frequency of 60 Hz. In order to produce the desired positive and negative voltages relative to the common or ground, a voltage divider is used to set the common point at ½ the DC output of current mode boost regulator 520. Switches 531 switches the AC output of the DC output of current mode boost regulator 520 for the positive alternation and switches the AC output of current mode boost regulator 520 to ground for the negative alternation. LED 545 is provided as a visual indicator for verifying the operability of circuit 500. Resistors 521 are current limiting resistors to prevent excess current during the switching time. The other components of circuit 500 are provided for circuit stability, operability, etc. Specifically, the circuitry associated with resisters 521 comprise a current limiting circuit for a maximum current output in the range of approximately 5 ma to 50 ma, thereby further enhancing the safety of the device constructed using circuit 500. Additional current limiting features may be added, depending on the specific application. Further, provisions can be made for switching between various voltage and current output levels, allowing the user to customize the output of circuit 500 to most closely match the actual field conditions for the circuit or equipment to be worked on by the technician.

Those skilled in the art will recognize that circuit 500 is only one example of how the various preferred embodiments of the present invention may be configured and deployed. Other circuits may be designed and deployed to accomplish the same basic functions.

In summary, the present invention provides for the broad application of a unique process for verifying the operational functionality of test equipment prior to working on electrical circuits and/or electrical equipment. While the various preferred embodiments of the present invention have been described in conjunction with specific examples, those skilled in the art will appreciate that the apparatus and methods of the present invention are suitable for deployment in other areas as well.

Lastly, it should be appreciated that the illustrated embodiments are preferred exemplary embodiments only, and are not intended to limit the scope, applicability, or configuration of the present invention in any way. For example, while the operability testing device has been described as a stand-alone device and/or as being incorporated into a flashlight, those skilled in the art will recognize that the functionality of the operability testing device may also be integrated with a voltmeter or similar device. Rather than being exhaustive, the foregoing detailed description provides those skilled in the art with a convenient road map for implementing various preferred exemplary embodiments of the present invention. Accordingly, it should be understood that various changes may be made in the function and arrangement of elements described in the exemplary preferred embodiments without departing from the spirit and scope of the present invention as set forth in the appended claims.

The invention claimed is:

1. A portable operability testing apparatus comprising:
    a power source;
    a voltage source electrically coupled to said power source, said voltage source being configured to provide at least one of an AC voltage and a DC voltage;
    a visual status indicator coupled to said power source;
    a housing containing said power source and said voltage source and said visual status indicator; and
    an electrical testing apparatus electrically coupled to said voltage source, wherein said portable operability testing apparatus is configured to perform a first operability test on said electrical testing apparatus and wherein said portable operability testing apparatus is further configured to perform a second operability test on said electrical testing apparatus using said portable operability testing apparatus after said electrical testing apparatus has been used to test an electrical circuit for the presence of a voltage but only if said electrical testing apparatus was found operable during said first operability test.

2. The portable operability testing apparatus of claim 1 wherein said power source comprises a 9V battery.

3. The portable operability testing apparatus of claim 1 wherein said visual status indicator is configured to provide a visual indication of the operability of said portable operability testing apparatus.

4. The portable operability testing apparatus of claim 1 wherein said housing comprises a polycarbonate plastic material.

5. The portable operability testing apparatus of claim 1 wherein said electrical testing apparatus comprises a current limiting circuit, said current limiting circuit permitting a maximum allowable output current for said portable operability testing apparatus.

6. The portable operability testing apparatus of claim 1 wherein said visual status indicator comprises a neon light.

7. The portable operability testing apparatus of claim 1 wherein said electrical testing apparatus comprises a voltmeter and said visual status indicator comprises an LED.

8. The portable operability testing apparatus of claim 1 further comprising:
    at least one of:
        an AC aperture, said AC aperture being configured to receive a first test probe associated with said electrical testing apparatus, said AC aperture being electrically connected to said voltage source, said AC aperture being configured to provide AC voltage to said first test probe; and
        a DC aperture, said DC aperture being configured to receive said first test probe, said DC aperture being electrically connected to said voltage source, said DC aperture being configured to provide DC voltage to said first test probe; and
    a ground aperture, said ground aperture being configured to provide a reference ground for a second test probe associated with said electrical testing apparatus.

9. The portable operability testing apparatus of claim 1 wherein said electrical testing apparatus comprises a voltmeter and said visual status indicator comprises an LED and said power source comprises a 9V battery.

10. The portable operability testing apparatus of claim 1 wherein:
    said electrical testing apparatus comprises a voltmeter, said voltmeter comprising:
        a first test probe, said first test probe being selectively coupled to said voltage source;
        a second test probe, said second test probe being selectively coupled to a reference ground; and
        a voltage indicator, said voltage indicator being configured to indicate the presence of voltage supplied by said voltage source;
    said visual status indicator comprises an LED, said visual status indicator being configured to provide a visual indication of the operability of said portable operability testing apparatus;
    said power source comprises a 9 V battery; and
    further comprising an electrical circuit selectively coupled to said first test probe and said second test probe, said voltage indicator being configured to indicate the presence of voltage supplied by said electrical circuit.

11. A method comprising the steps of:
    (a) performing a first operability test on an electrical testing apparatus using a portable operability testing apparatus, said portable operability testing apparatus comprising:
        a power source;
        a voltage source electrically coupled to said power source, said voltage source being configured to provide at least one of an AC voltage and a DC voltage; and
        a visual status indicator coupled to said power source;
    (b) using said electrical testing apparatus to test an electrical circuit for the presence of a voltage only if said electrical testing apparatus was found operable in step (a);
    (c) performing a second operability test on said electrical testing apparatus using said portable operability testing apparatus; and
    (d) physically accessing said electrical circuit only if said electrical testing apparatus was found operable in step (a) and step (c) and if no voltage was found in said electrical circuit in step (b).

12. The method of claim 11 further comprising the step of de-energizing said electrical circuit if a voltage was found in step (b).

13. The method of claim 11 further comprising the step of repairing or replacing said electrical testing apparatus if said electrical testing apparatus was found inoperable in either step (a) or step (c).

14. The method of claim 11 further comprising the steps of:
   de-energizing said electrical circuit if a voltage was found in step (b); and
   repairing or replacing said electrical testing apparatus if said electrical testing apparatus was found inoperable in either step (a) or step (c).

15. The method of claim 11 wherein said step of performing a first operability test on an electrical testing apparatus using a portable operability testing apparatus comprises the steps of:
   inserting a first voltmeter test probe into an AC aperture or a DC aperture;
   inserting a second voltmeter test probe into a ground aperture; and
   observing a visual indication on a voltmeter display, said visual indication indicting the presence of a voltage being supplied by said portable operability testing apparatus.

16. The method of claim 11 wherein said electrical testing apparatus comprises a voltmeter.

17. The method of claim 11 wherein said visual status indicator comprises an LED.

18. The method of claim 11 wherein said electrical testing apparatus comprises a voltmeter and said visual status indicator comprises an LED.

19. The method of claim 11 wherein said step of performing a second operability test on an electrical testing apparatus using a portable operability testing apparatus comprises the steps of:
   inserting a first voltmeter test probe into an AC aperture or a DC aperture;
   inserting a second voltmeter test probe into a ground aperture; and
   observing a visual indication on a voltmeter display, said visual indication indicting the presence of a voltage being supplied by said portable operability testing apparatus.

20. A method of combined operability and live-dead-live testing comprising the steps of:
   (a) inserting a first voltmeter test probe into at least one of an AC aperture or a DC aperture of a portable operability testing apparatus, said portable operability testing apparatus comprising:
      a power source; and
      a voltage source electrically coupled to said power source, said voltage source providing at least one of an AC voltage and a DC voltage;
   (b) inserting a second voltmeter test probe into a ground aperture;
   (c) observing a first visual indication on a voltmeter display, said first visual indication indicting the presence of a voltage being supplied by said portable operability testing apparatus;
   (d) using said electrical testing apparatus to test an electrical circuit for a voltage only if said electrical testing apparatus was found operable in steps (a), (b) and (c);
   (e) inserting said first voltmeter test probe into said AC aperture or said DC aperture of said portable operability testing apparatus;
   (f) inserting said second voltmeter test probe into said ground aperture;
   (g) observing a second visual indication on said voltmeter display, said second visual indication indicting the presence of a voltage being supplied by said portable operability testing apparatus;
   (h) physically accessing said electrical circuit only if said electrical testing apparatus was found operable in steps (a), (b), (c), (e), (f), and (g) and if no voltage was found in said electrical circuit during step (d).

* * * * *